United States Patent [19]

Dorey

[11] 3,772,683

[45] Nov. 13, 1973

[54] ANALOGUE TO DIGITAL CONVERTERS

[75] Inventor: Howard Anthony Dorey, Godalming, England

[73] Assignee: The Solartron Electronic Group Limited, Farnborough, Hampshire, England

[22] Filed: Sept. 27, 1972

[21] Appl. No.: 292,683

[52] U.S. Cl. ........................ 340/347 NT, 235/92 SH

[51] Int. Cl. ........................ H03k 13/02

[58] Field of Search ............... 340/347 NT, 347 AD, 340/15.5; 235/42 SH

[56] References Cited

UNITED STATES PATENTS

| | | | |
|---|---|---|---|
| 3,713,136 | 1/1973 | Nagy | 340/347 NT |
| 3,525,093 | 8/1970 | Marshall | 340/347 NT |
| 3,673,390 | 6/1972 | Krebs | 235/92 SH |
| 3,656,122 | 4/1972 | Pasternack | 235/92 SH |

*Primary Examiner*—Maynard R. Wilbur
*Assistant Examiner*—Jeremiah Glassman
*Attorney*—William R. Sherman et al.

[57] ABSTRACT

In an auto-ranging analogue-to-digital converter of the integrating type, the integrator has a single preferred decade range of operation, and there is provided means for converting the output of the integrator to an intermediate digital signal having ($N$+$R$−1) decades of resolution for analogue signals in the highest range applied to the integrator, where $N$ is the desired number of significant figures of resolution in the output digital signal and $R$ is the number of decade ranges of magnitude of the analogue signal at the input of the integrator. Selection means comprising a shift register is provided for selecting from the intermediate digital signal the $N$ most significant figures thereof to constitute the output digital signal, and there is also provided means for indicating the actual number of significant figures in the intermediate digital, so as to indicate the range in which the magnitude of the analogue signal lies. The lastmentioned means is used, if necessary, to set the integrator to its preferred range of operation for the next measurement cycle with the same analogue signal, and may also be used if necessary to operate an input attenuator at the input of the integrator.

19 Claims, 3 Drawing Figures

ANALOGUE TO DIGITAL CONVERTERS

Figure 1:
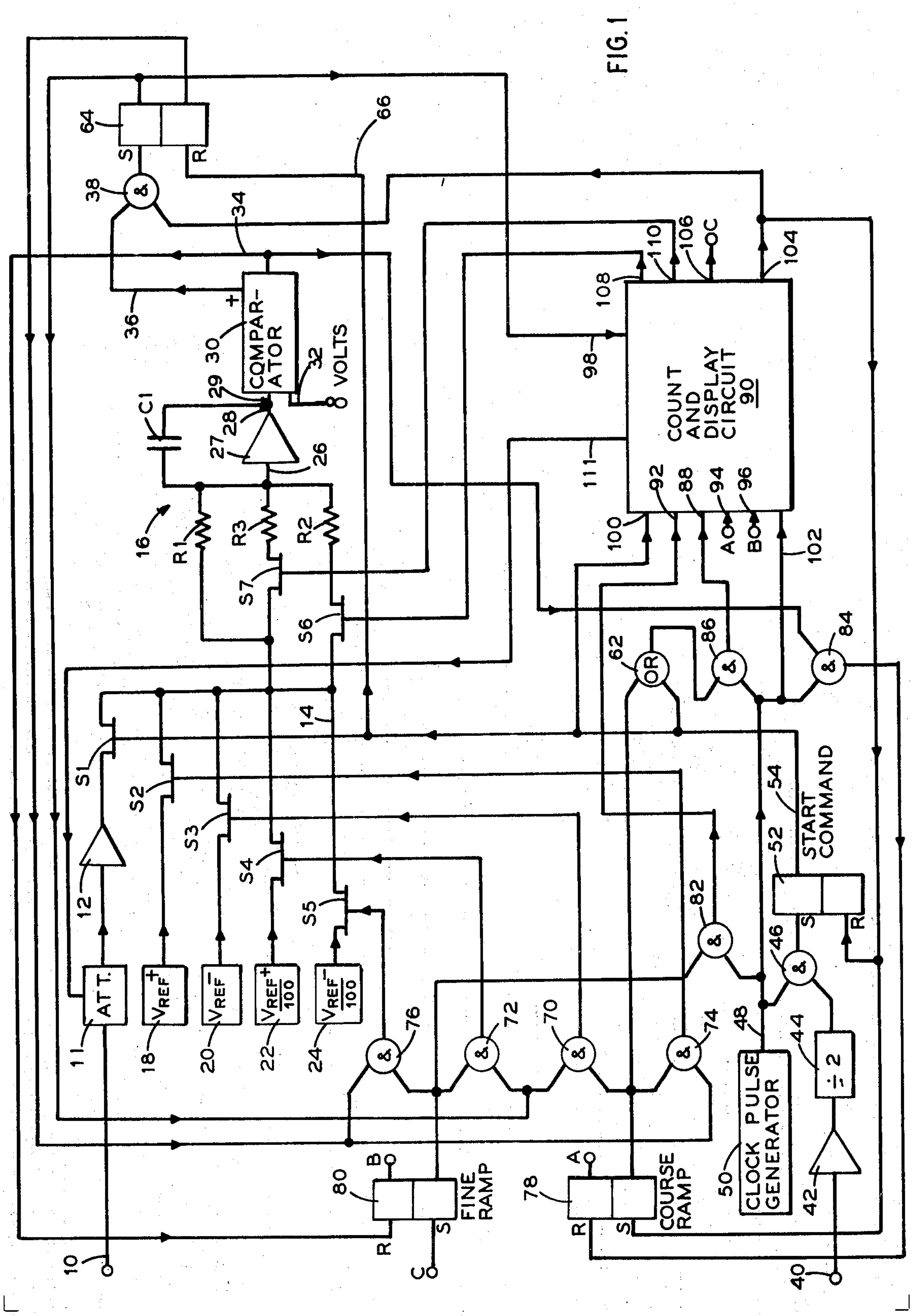

This invention relates to auto-ranging analogue-to-digital converters of the integrating type, and to electrical pulse counters for use therein, and is more particularly, but not exclusively, concerned with such analogue-to-digital converters for use as digital voltmeters.

Auto-ranging analogue-to-digital converters of the integrating type are often required to convert input signals having a wide range of possible magnitudes, typically a plurality of decade ranges of magnitude. In known converters of this type it has previously been the practice to provide an input attenuator having a plurality of ranges of attenuation each corresponding to a respective one of the decade ranges, so that for input signals whose magnitude is above the lowest range, the integrating part of the converter receives and integrates an attenuated version of the input signal. The overall accuracy of conversion for all ranges except the lowest range is therefore directly dependent upon the accuracy of the component values of the input attenuator. The components of the attenuator thus tend to be relatively expensive, and it is necessary to use relays to switch between the various ranges of the attenuator, so as to minimise stray resistance which might affect the values of the components. Furthermore, when known converters of this type are in, say, their highest range of operation, i.e., when the input attenuator is set to its highest range, and the magnitude of the input signal falls to the lowest range (or a new input signal whose magnitude lies in the lowest range is applied to the converter), the converter automatically ranges downwards one range at a time, performing a measurement at each range, until the correct range and thus the correct measurement is reached. A five decade converter therefore requires five measurement cycles to reach the correct range. This reduces the conversion speed, which can be very disadvantageous in data logging applications, and is irritating to the user in laboratory or similar applications.

It is an object of the present invention to provide an auto-ranging analogue-to-digital converter of the integrating type in which, to provide capability of converting input signals whose magnitudes lie in a given number of ranges, either no input attenuator or an input attenuator having a reduced number of ranges is required. It is a further object of the invention to provide such a converter in which auto-ranging is effected more rapidly than in the above-mentioned known converters.

According to one aspect of the present invention, an auto-ranging analogue-to-digital converter of the integrating type, for converting an analogue signal to a digital signal which is representative of the magnitude of the analogue signal and which has N significant figures of resolution in a respective one of R successive ranges of magnitude of the analogue signal, comprises:

integrating means responsive to the analogue signal for producing an output signal whose magnitude is dependent upon the magnitude of the analogue signal;

means for converting the output signal from the integrating means to an intermediate digital signal which is representative of the magnitude of the analogue signal and which has up to at least $(N+R-1)$ significant figures of resolution for analogue signals whose magnitude lies in the highest range;

selection means for selecting from the intermediate digital signal an output digital signal composed of the $N$ most significant figures of the intermediate digital signal;

means for producing a further signal indicative of the actual number of significant figures in the intermediate digital signal, whereby said further signal is also indicative of the range in which the magnitude of the analogue signal lies; and adjusting means, responsive to said further signal, for adjusting the operation of the integrating means to bring the magnitude of the output signal produced thereby within a single predetermined range of magnitudes, irrespective of the range in which the magnitude of the analogue signal lies.

Preferably there is provided means for applying the analogue signal to the integrating means during a sampling interval of predetermined duration, so as to cause the output of the integrating means to ramp away from a datum level to a level which constitutes said output signal, and means for applying a reference signal to the integrating means during a digitising interval, so as to cause the output of the integrating means to ramp towards a second datum level, said means for converting the output signal from the integrating means comprising an electrical pulse counter, and clock pulse generator means arranged to supply clock pulses to the counter throughout the digitising interval.

The first and second datum levels are preferably the same. Conveniently, the integrating means includes an input resistance and a capacitance arranged to be charged through the input resistance, at least one of the resistance and the capacitance being adjustable in value, and the adjusting means is operable to adjust the value of said one of the resistance and the capacitance so as to tend to bring the magnitude of said output signal within said single predetermined range, the value of said one of the resistance and the capacitance remaining unchanged between any given sampling interval and its corresponding digitising interval.

Thus in any given conversion cycle of sampling interval and digitising interval, the input signal and the reference signal are both applied to the same selected values of the capacitance and the input resistance of the integrating means, and the selected values are adjusted if necessary between successive cycles of sampling interval and digitising interval, so that during the next conversion cycle the magnitude of the output signal from the integrating means falls within said single predetermined range. However, it is only necessary for the values of the resistance and the capacitance to remain constant throughout a cycle, which requirement is readily met by relatively inexpensive conventional components.

In a preferred embodiment of the invention, the value of the capacitance is fixed and the value of the resistance is adjustable. Thus the resistance may comprise a plurality of resistors, and the adjusting means may comprise a switching arrangement operable to connect an appropriate combination of the resistors in the input of the integrating means. In this specification, the term "combination of the resistors" is to be understood to include a single resistor.

The input resistors of the integrating means are preferably connected together in parallel, in which case the switching arrangement preferably comprises at least one switch device, for example a semi-conductor device such as a field effect transistor, connected in series with one of the resistors.

Advantageously, the means for converting the output signal from the integrating means may further include scaling means arranged to scale down the reference signal and the numerical weight with which the clock pulses are counted by a common factor when the output of the integrating means reaches a value close to the second datum level.

Thus the output of the integrating means may be arranged to ramp from said level constituting said output signal through the second datum level to said value close to the second datum level, and the scaling means may include means for reversing the polarity of the reference signal, so as to cause the output of the integrating means to ramp back from said value to the second datum level, and means for subtracting clock pulses from the count in the counter while the output of the integrating means is ramping back from said value to the second datum level.

The adjusting means may further include an adjustable attenuator coupled to the input of the integrating means and operable to attenuate the analogue signal before its application to the integrating means.

The counter preferably has at least ($N+R-1$) cascaded stages, each of which corresponds to a respective one of the significant figures of the intermediate digital signal.

Each stage of the counter preferably comprises a plurality $m$ of bistable circuits, and the counter may include switching means operative to switch the configuration of the bistable circuits from that composing the counter to that of a shift register. Thus each stage of the counter may be a decade stage consisting of a five bit shift register connected in Johnson ring configuration.

In a preferred embodiment of the invention, the selection means comprise a further shift register having $N$ stages, each stage corresponding to a respective one of the significant figures of the output digital signal, and means for shifting the figures of intermediate digital signal, in descending order of their significance, from the counter into the further shift register until the $N$ most significant figures of the intermediate digital signal are positioned in the further shift register.

The further shift register may include switching means operative to transform it into a recirculating shift register when it contains said output digital signal, which switching means preferably operates in response either to the presence of a digital signal representative of a figure of the output digital signal other than zero in the $N$th stage of the further shift register when the figures of the output digital signal have been shifted through less than a predetermined number of stages of the further shift register, or to the shifting of the figures of the output digital signal through said predetermined number of stages.

There may be provided means for effecting dynamic readout of the figures of the output digital signal in the further shift register, said means being connected to one stage of the further shift register so as to read out the figures as they are circulated one by one into this one stage.

According to another aspect of the present invention, there is provided an electrical pulse counter for use in an analogue-to-digital converter, said counter comprising a plurality P of cascaded stages, each of which counts one number or digit in a number system of radix $n$ and each of which comprises a plurality $m$ of bistable circuits and switching means operative to switch the configuration of the bistable circuit from that composing the counter to that of a shift register, means for supplying shift pulses to the shift register, and means operative between each successive group of $m$ shift pulses to transfer the complement of the number in the $P$th stage into the first stage, whereby to transform the number in the 2nd to the $P$th stages of the shift register at the start of the group of $m$ pulses into the complement of that number after P groups of pulses.

The counter is thus effectively reversible, since it is possible to count a first number of pulses in the 2nd to the $P$th stages, to transform this number into the complement thereof, and then to count a second number of pulses, at which point the total count in the counter is equal to the complement of the number obtained by subtracting the second number from the first number.

The stages of the counter are preferably disposed so that the $P$th stage is adjacent to the 1st stage.

This counter may advantageously be used as the counter in the analogue-to-digital converter of the preceding statements of invention, in which case $P$ is at least equal to ($N+R-1$).

Figure 2A:
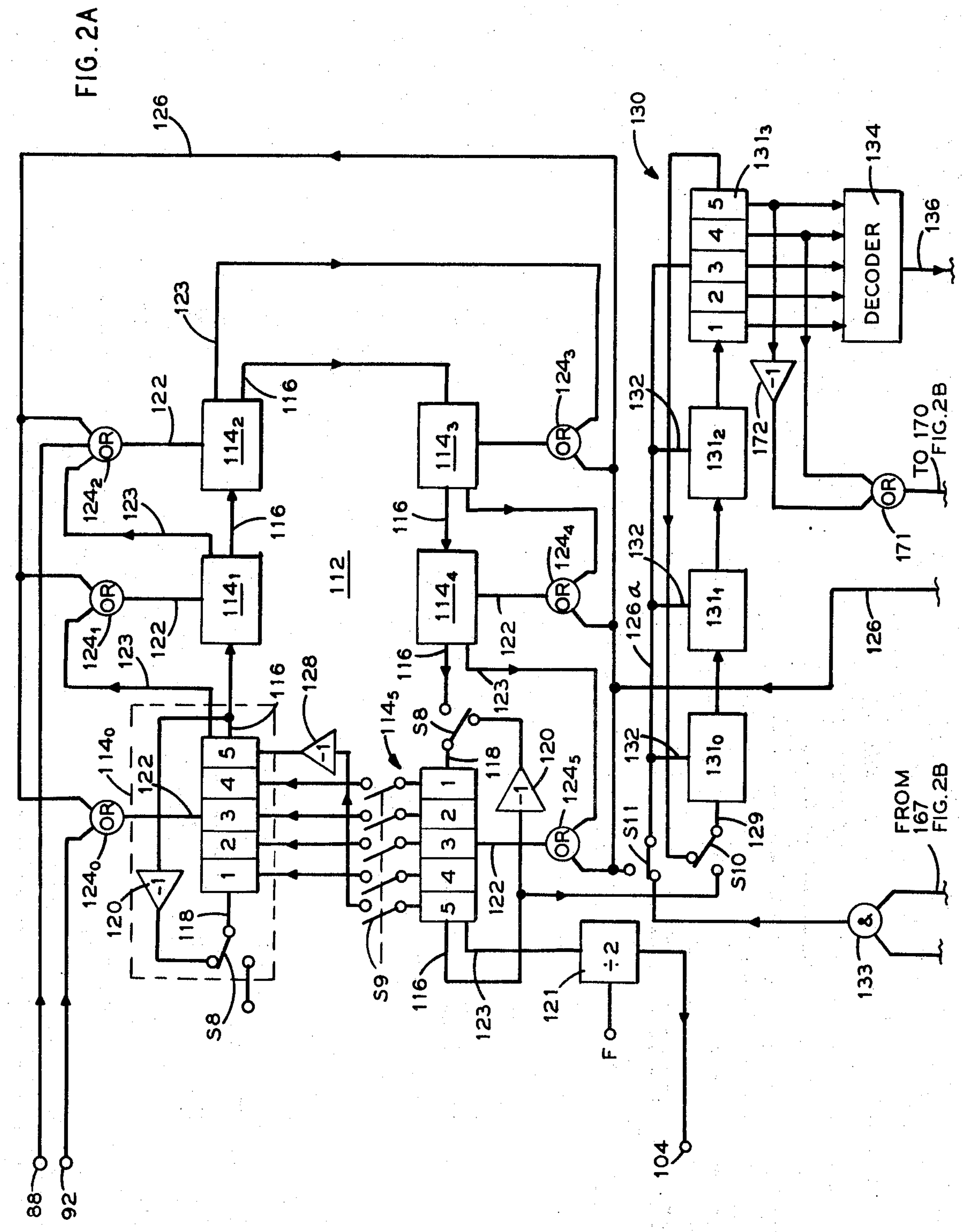

The invention will now be described, by way of non-limitative example only, with reference to the accompanying drawings, of which:

FIG. 1 is a simplified schematic circuit diagram of an auto-ranging digital voltmeter of the integrating type in accordance with the present invention; and FIGS. 2A, B are a more detailed schematic circuit diagram of part of the voltmeter of FIG. 1.

The digital voltmeter shown in FIG. 1 has an input 10, which is connected in use to receive a D.C. input voltage to be measured: typically, the input voltage lies in the range of 0 to 1,000 volts, and is to be measured in five ranges, namely 1,000 volts full scale, 100 volts full scale, 10 volts full scale, 1 volt full scale and 100 millivolts full scale. The input 10 is connected via an automatically selectable divide-by-one-hundred attenuator 11 and a unity-gain buffer amplifier 12 to a switch S1 which, in the example illustrated, comprises a field effect transistor. The switch S1 is connected in turn to the input 14 of an integrating amplifier 16. Also connected to the input 14, via respective switches S2, S3, S4 and S5 which are similar to the switch S1, are positive and negative main reference voltage sources 18, 20, and positive and negative divided reference voltage sources 22, 24 respectively. Typically the output voltages of the sources 18, 20 are respectively plus and minus 10 volts, while the output voltages of the sources 22, 24 are exactly one hundredth of the respective output voltages of the sources 18, 20 and are derived therefrom by potential division.

The integrating amplifier 16 comprises three input resistors $R1$, $R2$, $R3$ which are connected in parallel between the input 14 and the input 26 of a high gain amplifier 27. The resistors $R1$, $R2$ and $R3$ may typically have values such that $R1 = 10$ ($R1$, $R2$ in parallel) $=$ 100 ($R1$, $R2$, $R3$ in parallel), and they may be conventional film resistors; their tolerances are not critical, and may for example be ±2 percent. Switches S6 and S7 are connected in series with $R2$ and $R3$ respectively.

The amplifier 27 has an output 28 which is connected via a feedback capacitor C1 to its input 26, and which is also connected to one input 29 of a comparator 30. The comparator 30, which may typically include a pair of transistors (not shown) connected as a long-tailed pair, has a second input 32 connected to receive a datum level of zero volts, and a first output 34 arranged to produce an output signal of predetermined duration at logic level "1" when the voltage at the input 29 reaches zero. The comparator 30 also has a further output 36, which is arranged to produce an output signal at logic level "1" when the voltage at the input 29 is positive, and an output signal at logic level "0" when the voltage at the input 29 is negative. The output 36 is connected to one input of a two-input AND gate 38.

The digital voltmeter also has a further input 40 connected to receive an A.C. signal derived from the local mains voltage at, typically, 50Hz: this signal may for example be taken from a low voltage tapping of a transformer (not shown) forming part of the power supply system (not shown) of the voltmeter. The input 40 is connected via a Schmitt trigger 42 and a divide-by-two bistable circuit 44 to one input of a two-input AND gate 46, whose other input is connected to the output 48 of a 1MHz clock pulse generator 50. The output of the AND gate 46 is connected to the "set" input of a bistable circuit 52, whose "set" output constitutes a "START COMMAND" line 54, and is connected to the gate of the switch S1, (i.e., the operating electrode of the field effect transistor). The line 54 is also connected to one input of a two-input OR gate 62 and to the "reset" input of a bistable circuit 64, whose "set" input is connected to the ouput of the AND gate 38.

The "set" output of the bistable circuit 64 is connected to one input of each of two two-input AND gates 70, 72, whose outputs are respectively connected to the gates of the switches S3 and S4: similarly, the "reset" output of the bistable circuit 64 is connected to one input of each of two two-input AND gates 74, 76, whose outputs are respectively connected to the gates of the switches S2 and S5. The other input of each of the AND gates 70, 74 is connected to the "set" output of a bistable circuit 78, as well as to the other input of the OR gate 62, while the other input of each of the AND gates 72, 76 is connected to the "set" output of a bistable circuit 80. The "set" output of the bistable circuit 80 is also connected to one input of a two input AND gate 82, whose other input is connected to the output 48 of the clock pulse generator 50.

The "reset" input of the bistable circuit 78 is connected to the output of a two-input AND gate 84, one of whose inputs is connected to the output 34 of the comparator 30 and to the "reset" input of the bistable circuit 80. The other input of the AND gate 84 is connected to the output 48 of the clock pulse generator 50. The output of the OR gate 62 is connected to one input of a two-input AND gate 86, whose other input is also connected to the output 48 of the clock pulse generator 50. The output of the AND gate 86 is connected to a first count input 88 of a count-and-display circuit 90, while the output of the AND gate 82 is connected to a second count input 92 of the circuit 90.

The count-and-display circuit 90 has two further inputs 94, 96 which are respectively linked at A and B to the "reset" outputs of the bistable circuits 78, 80, a polarity display input 98 which is connected to the "set" output of the bistable circuit 64, a start input 100 connected to the line 54, and a clock pulse input 102 connected to the output 48 of the clock pulse generator 50. The circuit 90 also has a "full house" output 104 which is connected to the other input of the AND gate 38, to the "reset" input of the bistable circuit 52 and to the "set" input of the bistable circuit 78, a further output 106 linked at C to the "set" input of the bistable circuit 80, two "range-change" 108, 110 which are respectively connected to the gates of the switches S6, S7, and a further "range-change" output 111 which is connected to switch the attenuation factor of the attenuator 11 from unity to one hundred when energised.

Figure 2B:
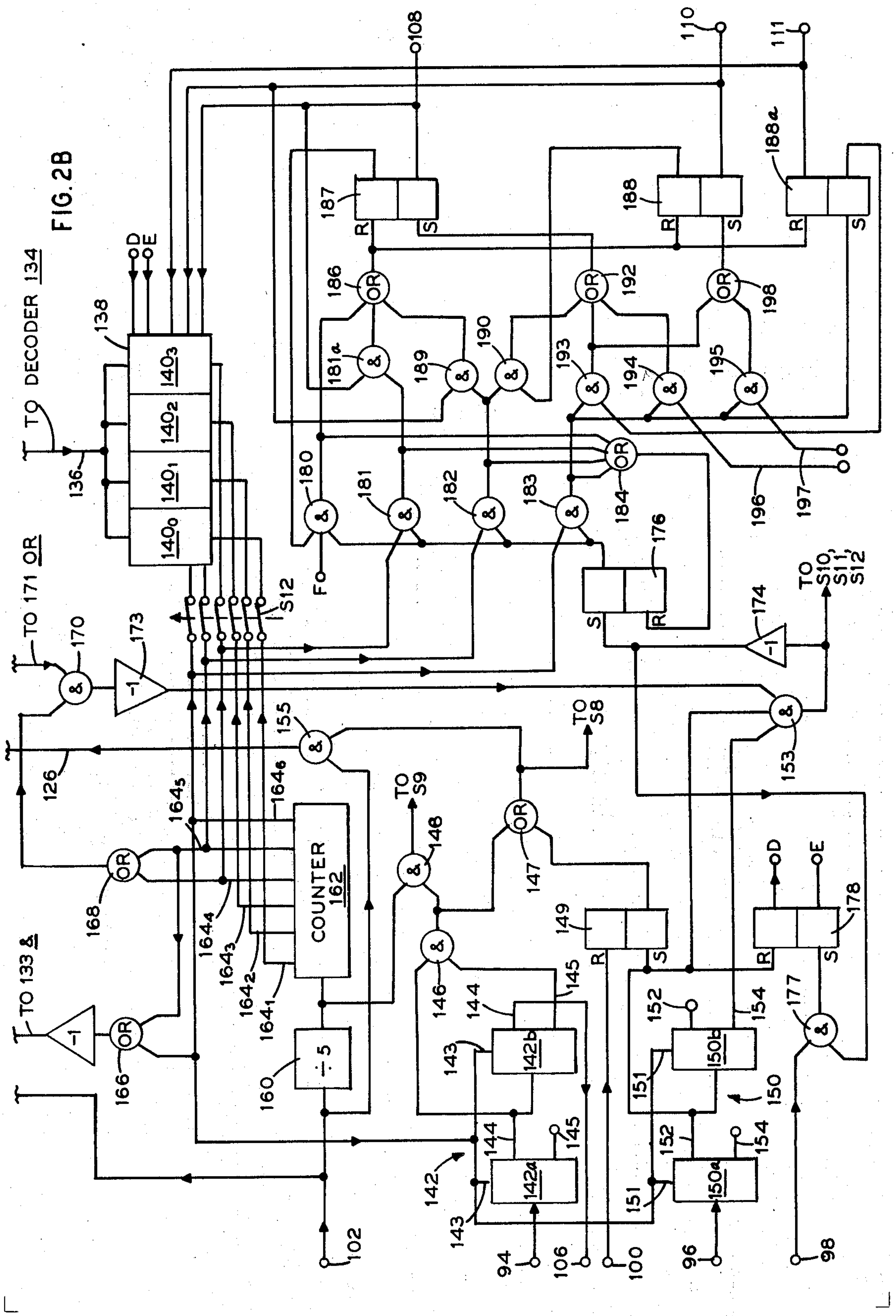

The count-and-display circuit 90 is shown in more detail in FIG. 2, and comprises a counter 112 having six decade stages $114_0$, $114_1$, $114_2$, $114_3$, $114_4$, $114_5$: the suffices are indicative of the power of ten represented by each decade stage, and will be used only when it is necessary to distinguish between the stages. Each of the stages 114 is similar to the stages $114_0$ and $114_5$, which are shown in more detail, and comprises five bistable circuits (numbered 1 to 5) arranged as a five-bit shift register whose output 116 is connected back to its input 118 via an inverter 120 and a changeover switch S8. Each stage 114 also has a clock input 122. With the switches S8 in the illustrated position, each stage 114 therefore constitutes a Johnson ring, so that when pulses are applied to the input 122 of a stage 114, it cycles through the states identified in Table 1 below:

TABLE 1

| Pulse Count | State of Stage | Nines Complement State |
|---|---|---|
| 0 | 00000 | 00001 |
| 1 | 10000 | 00011 |
| 2 | 11000 | 00111 |
| 3 | 11100 | 01111 |
| 4 | 11110 | 11111 |
| 5 | 11111 | 11110 |
| 6 | 01111 | 11100 |
| 7 | 00111 | 11000 |
| 8 | 00011 | 10000 |
| 9 | 00001 | 00000 |

Each stage 114 has a nine-recognition output 123, at which an output signal is produced every time the stage passes from a pulse count of nine to a pulse count of 0. The output 123 of the stage $114_5$ is connected to a further bistable circuit 121, which is arranged to produce an output signal for every second signal at its input: the output of this bistable circuit constitutes the "full house" output 104 of the circuit 90.

The respective clock input 122 of each stage 114 is connected to the output of a respective one of six OR gates $124_0$ to $124_5$. The OR gate $124_2$ has three inputs, one of which constitutes the input 88 of the circuit 90 and another of which is connected to a common shift pulse rail 126, while the remainder of the OR gates 124 each have two inputs, one of which is connected to the rail 126. The other input of the OR gate $124_0$ constitutes the input 92 of the circuit 90, while the nine-recognition output 123 of each stage 114 is connected to the other input of the OR gate of the next succeeding stage 114 (i.e., the output 123 of stage $114_0$ is connected to the other input of the OR gate $124_1$).

Thus, when the switches S8 are in the illustrated position, the counter 112 serves as a six decade counter to count pulses applied to the input 92: each pulse applied to the input 88 therefore increases the overall count of the counter 112 by 100. However, when the switches S8 are moved to the other position and pulses are applied to the rail 126, the counter 112 is transformed into a 30-bit shift register. A counter similar to the counter 112 as described so far is described in more detail in our pending United Kingdom Patent Application no. 58624/69 (Ser. No. 1,272,860).

It will be noted that the counter 112 is shown "folded back" upon itself, so that first and last stages $114_0$ and $114_5$ are adjacent each other with the order of their bistable circuits reversed. The outputs of bistable circuits 1 to 4 of stage $114_5$ are connected, via respective switches S9, to the inputs of bistable circuits 4 to 1 respectively of stage $114_0$, while the output of bistable circuit 5 of stage $114_5$ is connected via another switch S9 and an inverter 128 to the input of bistable circuit 5 of stage $114_0$. The switches S9 are operable in unison. The "folded back" arrangement is therefore a convenient way of physically disposing the counter 112, since it simplifies the physical arrangement of the connections between the stages $114_0$ and $114_5$.

It will be appreciated that if the switches S9 are simultaneously closed while stage $114_5$ contains any one of the Johnson ring codes in the first code column of Table 1, the nines complement of that code will be transferred into stage $114_0$, since the order of the first four bits of the code will be reversed, while the fifth bit will be inverted.

The output 116 of stage $114_5$ is connected via a changeover switch S10 to the input 129 of a 20-bit shift register 130, which comprises four five-bit shift register stages, $131_0$, $131_1$, $131_2$, $131_3$, arranged in cascade. Each stage 131 has a clock input 132 connected to a common shift pulse rail 126*a*, and the output of the stage $131_3$ is connected back to the input 129: with the switch S10 in the illustrated position, the shift register 130 is thus a recirculating shift register. The rail 126*a* is connected, via a changeover switch S11 operable in synchronism with the switch S10, either to the rail 126 or, as illustrated, to the output of two-input AND gate 133.

Each stage 131 is similar to the stage $131_3$, which is shown in more detail and comprises five bistable circuits numbered 1 to 5. The output of each bistable circuit of the stage $131_3$ is connected to a one-out-of-ten decoder 134, which has a 10-line output highway indicated at 136. The highway 136 is connected to respective inputs of a four decade display unit 138 which comprises four neon indicator tubes $140_0$, $140_1$, $140_2$, $140_3$: each line of the highway 136 is connected to a respective one of the ten number cathodes of each tube 140.

The input 94 of the circuit 90 is connected to the input of a shift register 142 comprising two bistable circuits 142*a*, 142*b* which are arranged in cascade and which have respective clock inputs 143. Each of the bistable circuits has a "true" output 144 which assumes the logic level at its input when a clock pulse is applied to its clock input 143, and a "false" output 145 which is inverted with respect to the output 144. The "true" output 144 of the bistable circuit 142*b* constitutes the output 106 of the circuit 90. The "tru" output 144 of the bistable circuit 142*a* and the "false" output 145 of the bistable circuit 142*b* are connected to the respective inputs of a two-input AND gate 146, whose output is connected to one input of a two-input OR gate 147, and to one input of a two-input AND gate 148. The other input of the OR gate 147 is connected to the "set" output of a bistable circuit 149, whose "reset" input constitutes the input 100 of the circuit 90. The input 96 of the circuit 90 is connected to the input of a further shift register 150, similar to the shift register 142, and comprising two bistable circuits 150*a*, 150*b* which are arranged in cascade and which have respective clock inputs 151. The "true" output 152 of the bistable circuit 150*a* is connected to the "set" input of the bistable circuit 149 and to one input of a three-input AND gate 153, while the "false" output 154 of the bistable circuit 150*b* is connected to another input of the AND gate 153.

The output of the OR gate 147 is connected to operate the switches S8, i.e., to move them from the illustrated position to the other position, and to one input of a two-input AND gate 155 whose output is connected to the rail 126.

The clock pulse input 102 of the circuit 90 is connected to one input of the AND gate 133, to the other input of the AND gate 155, and, via a divide-by-five circuit 160, to the input of a six-stage ring counter 162. The output of the circuit 160 is also connected to the other input of the AND gate 148, whose output is arranged to close the switches S9 for a predetermined short period of time. The counter 162 has six outputs $164_1$ to $164_6$ which are arranged to be sequentially energised. The output $164_6$ is connected to the clock inputs 143, 151 of the shift registers 142, 150 respectively. The outputs $164_5$ and $164_6$ are further connected to the inputs of a two-input OR gate 166, whose output is connected via an inverter 167 to the other input of the AND gate 133. Additionally, the outputs $164_4$ and $164_5$ are connected to the inputs of a two-input OR gate 168 whose output is connected to one input of a two-input AND gate 170.

The other input of the AND gate 170 is connected to the output of a two-input OR gate 171, one of whose inputs is connected to the output of the fourth bistable circuit of the stage $131_3$, and the other of whose inputs is connected, via an inverter 172, to the output of the fifth bistable circuit of the stage $131_3$. The output of the AND gate 170 is connected via a further inverter 173 to the other input of the AND gate 153.

The output of the AND gate 153 is arranged to move the switches S10, S11 from the illustrated position to the other position, and is also connected, via an inverter 174, to the "set" input of a bistable circuit 176. The output of the inverter 174 is also connected to one input of a two-input AND gate 177, whose other input constitutes the polarity display input 98 of the circuit 90 and whose output is connected to the "set" input of a bistable circuit 178. The "reset" input of the bistable circuit 178 is connected to the "true" output 152 of the bistable circuit 150*a*.

The "set" output of the bistable circuit 176 is connected to one input of a three-input AND gate 180, and to one input of each of three two-input AND gates 181, 182, 183, whose other inputs are respectively connected to the outputs $164_4$, $164_5$ and $164_6$ of the counter 162. The outputs of the AND gates 180–183 are connected via a four-input OR gate 184 back to the "reset" input of the bistable circuit 176, while the output of the AND gate 181 is also connected to one input of a two-input AND gate 181*a*. The respective outputs of the AND gates 180 and 181*a* are connected via two inputs of a three-input OR gate 186 to the respective "reset" inputs of three bistable circuits 187, 188, 188*a*, while the output of the AND gate 182 is also connected to one input of each of two two-input AND gates 189, 190. The output of the AND gate 189 is connected to the other input of the OR gate 186, while the output of the AND gate 190 is connected via one input of a three-input OR gate 192 to the "set" input of the bistable circuit 187. Additionally, the output of the AND gate 183 is connected to one input of each of three two-input AND gates 193, 194, 195 and to the "set" input of the bistable circuit 188*a*. The other inputs of the AND gates 189, 190 are respectively connected to the "set" and "reset" outputs of the bistable circuit 188. The other input of the AND gate 193 is connected to the "set" output of the bistable circuit 188*a*, while the respective other inputs 196, 197 of the AND gates 194, 195 are connected to receive respective signals which will be described in more detail hereinafter. The outputs of the AND gates 193, 194 are respectively connected to the other two inputs of the OR gate 192, while the output of the AND gate 195 is connected via one input of a two-input OR gate 198 to the "set" input of the bistable circuit 188. The other input of the OR gate 198 is connected to the output of the AND gate 193. The "reset" output of the bistable circuit 187 is connected to anotheer input of the AND gate 180, whose third input is connected at F to receive an overflow signal from the bistable circuit 121, as will hereinafter be described.

The "set" outputs of the bistable circuits 187, 188, and the "reset" output of the bistable circuit 188*a* respectively constitute the "range-change" outputs 108, 110, 111 of the circuit 90.

Finally, the outputs $164_1$ to $164_4$ of the counter 162 are respectively connected via respective normally-closed switches S12 to the tubes $140_0$ to $140_3$ (to the common anodes therein). Also, the "set" outputs of the bistable circuits 187, 188 are connected to the display unit 138 (to the respectively cathodes of decimal point and/or "*m* V" or "V" symbol indicator tubes (not shown) therein), while the output $164_5$ is connected via another normally-closed switch S12 to the commoned anodes of these tubes. Further, the "set" and "reset" outputs of the bistable circuit 178 are connected at D and E to the display unit 138 (to the respective cathodes of a "plus" and "minus" symbol indicator tube (not shown) therein), while the output $164_6$ is connected via yet another normally-closed switch S12 to the common anode of this tube. The normally closed switches S12 are arranged to be simultaneously opened by the output of the AND gate 153.

In operation, let us assume that positive DC input voltage of just under 10 volts, say 9.98723 volts, is applied to the input 10 of the voltmeter, that the attenuator 11 is set to its attenuation factor of unity, and that the switches S1 to S7 inclusive are all initially open, while the switches S8 to S12 are in the positions illustrated in FIG. 2.

The signal at the output of the bistable circuits 44 is a 25 Hz square wave 1:1 mark/space ratio, and the first positive-going excursion thereof opens the AND gate 46, so that the next succeeding clock pulse from the clock pulse generator 50 sets the bistable circuit 52 and thus initiates a positive "START COMMAND" signal on the line 54.

The "START COMMAND" signal closes the switch S1, resets the bistable circuit 64 if appropriate, opens the AND gate 86 via the OR gate 62, and resets the bistable circuit 149 in the count-and-display circuit 90. As the switch S1 closes, the input voltage is applied via the buffer amplifier 12 to the input 14 of the integrating amplifier 16, and begins to charge the capacitor C1 linearly via the resistors R1, R2 and R3 in series. At the same time the clock pulses immediately following the opening of the AND gate 86 pass therethrough to the input 88 of the count-and-display circuit 90, and the counter 112 therein commences to count up, each clock pulse increasing the count by one hundred as already described.

As the voltage at the output 28 of the amplifier 27 begins to ramp up in a positive direction, the comparator 30 produces at its output 36 an output signal which opens the AND gate 38. When the counter 112 completes two full counts of 1,000,000 (i.e., 20 milliseconds after the beginning of the "START COMMAND" signal), the bistable circuit 121 produces at the output 104 an output signal which sets the bistable circuit 64, thereby opening the AND gates 70, 72 and energising the polarity display input 98 of the circuit 90, and which resets the bistable circuit 52. This terminates the "START COMMAND" signal, and thus opens the switch S1.

The period for which the switch S1 is closed is the sampling interval, and it will be appreciated that it is substantially equal to one period of the 50Hz mains voltage. This ensures fairly good rejection by the integrating amplifier 16, typically 60dB, of any series mode interference at 50Hz which may be present in the input voltage. However, if greater rejection is required, the integrating amplifier 16 may be modified to incorporate the features of the integrating means disclosed in our pending United Kingdom Patent Application no. 55817/70, (Ser. No. 201,553, filed Nov. 23, 1971, now U.S. Pat. No. 3,729,733 dated Apr. 24, 1973).

The signal at the output 104 of the circuit 90 also sets the bistable circuit 78, which in turn closes the switch S3 via the already-open AND gate 70, so as to apply the output of the negative reference voltage source 20 to the input 14 of the integrating amplifier 16. It will be appreciated that, if the input voltage had been negative, the AND gates 74 and 76 would have been opened by the "reset" output of circuit 64: in this case, the bistable circuit 78 would have opened the switch S2 so as to apply the output of the positive reference voltage source 18 to the input 14 of the integrating amplifier 16.

The signal at the "set" output of the bistable circuit 78 also serves to keep and AND gate 86 open via the OR gate 62. The capacitor C1 now begins to discharge linearly via the resistors R1, R2 and R3, to the negative reference voltage source 20, and at the same time the counter 112 recommences to count up in response to clock pulses, its count still being increased by one hundred for each clock pulse. When the voltage at the output 28 of the amplifier 27 reaches zero, typically in just under 10 milliseconds, the signal at the output 34 of the comparator 30 opens the AND gate 84, thus permitting the next succeeding clock pulse from the clock pulse generator 50 to reset the bistable circuit 78. This in turn closes the AND gate 70 (thus opening the switch S3), stops the counter 112 by closing the AND gate 86, and applies a signal at logic level "1" to the input of the shift register 142 in the circuit 90. The count in the counter 112 at this point will be referred to as the first count.

The voltage at the output 28 of the amplifier 27 goes negative by a small amount in the short time between the opening of the AND gate 84 by the comparator 30 and the succeeding clock pulse.

The signal at the input of the shift register 142 is clocked to the "true" output 144 of the bistable 142*a* when the count of the counter 162 next goes from five to six (the counter 162 is, of course, running all the time). This opens the AND gate 146, which in turn opens the AND gate 148 and is simultaneously operative, via the OR gate 147, to open the AND gate 155 and move the switches S8 from the illustrated position to the other position. The counter 112 is thus transformed into a shift register as hereinbefore described. The opening of the AND gate 148 is effective to briefly operate the switches S9, so that the nines complement of the digit in stage $\mathbf{114_5}$ of the counter/register 112 is transferred into stage $\mathbf{114_0}$, which is empty at this time.

Clock pulses are now supplied to the rail 126 via the AND gate 155, and shift the transferred and complemented digit in the stage $\mathbf{114_0}$ into the stage $\mathbf{114_1}$: the digits in the stages $\mathbf{114_1}$ to $\mathbf{114_4}$ are each simultaneously shifted into the next highest stage. After five clock pulses, all the digits have been moved up one stage, and the circuit 160 again briefly operates the switches S9 to transfer the nines complement of the digit currently in stage $\mathbf{114_5}$ into stage $\mathbf{114_0}$. This process of shifting one whole stage and complementing is repeated until the counter 162, connected to the output of the circuit 160, again attains a count of six and clocks the signal at the input of the bistable circuit **142*b* to the "true" output 144 thereof. The AND gate 146 is closed by the signal at the "false" output 145 of the bistable circuit 142*b*, and in turn closes the AND gates 148 and 155. At this point, the counter/register 112** reverts to its counter state, and the total count therein is the nines complement of the first count.

The signal at the "true" output 144 of the bistable circuit **142*b* sets the bistable circuit 80, and the signal at the "set" output of the bistable circuit 80 in turn closes the switch S4 via the already open AND gate 72. This applies the output of the positive reference voltage source 22 to the input 14 of the integrating amplifier 16, so that the capacitor C1 recommences charging and the small negative voltage at the output 28 approaches zero from below. Again, it will be appreciated that if the original input voltage had been negative, the bistable circuit 80 would have opened the switch S5 via the AND gate 76, so as to apply the output of the negative reference voltage source 24 to the input 14 of the integrating amplifier 16**.

The signal at the "set" output of the bistable circuit 80 also opens the AND gate 82, thus supplying clock pulses to the input 92 of the counter 112 while the capacitor C1 re-charges. The counter 112 again counts up in response to the clock pulses, each pulse adding one to its count: the total number of these pulses will be referred to as the second count.

When the voltage at the output 28 of the amplifier 27 again reaches zero, the signal at the output 34 of the comparator 30 resets the bistable circuit 80. This in turn closes the AND gate 72, thus opening the switch S4, and stops the counter 112 via the AND gate 82. The count in the counter 112 at this time, hereinafter called the final count, is the nines complement of the count obtained by subtracting the second count from the first count, since if the first count is $C1$, the second count is $C2$, and $C2<C1<B$ where $B$ is an integer, e.g., 999,999, then $B-C1+C2 = B-(C1-C2)$.

The period for which the switches S3 and S4 (or the switches S2 and S5) are closed in the digitising interval, and the final count in the counter 112 at the end of this period is a measure of the duration of the interval. It will be appreciated that the rate of change of the voltage at the output 28 of the amplifier 27 is 100 times more rapid when either of the switches S2, S3 is closed than when either of the switches S4, S5 is closed: these changes are therefore respectively known as the fast (or coarse) ramp and the slow (or fine) ramp. The duration of the fine ramp, measured in units of single clock pulses, is effectively subtracted in the counter 112 from the duration of the coarse ramp, measured in units of 100 clock pulses, and thus interpolates the time interval between the penultimate and ultimate clock pulses of the coarse ramp to determine with greater resolution the time at which the coarse ramp passed through the zero volt level. This particular arrangement of the digitising interval, and circuitry for achieving it, are described and claimed in our United Kingdom Pat. No. 1,220,991.

The integrating amplifier 16 is designed to produce an output voltage of 10 volts at the output 28 when an input voltage of 10 volts is applied to the resistor R1, and, as already mentioned, is arranged to charge and discharge substantially linearly: the most linear part of its output characteristic is normally the upper part, i.e., between say ten volts and 1 volt. Moreover, the frequency of the clock pulse generator 50, and the reference voltages of the various sources, 18, 20, 22, 24 are selected to produce in the counter 112 a change of count of 100,000 for every volt of the input voltage, and therefore a final count equal to the nines complement of 998723 for the assumed input voltage.

When the bistable circuit 80 is reset, the signal at its "reset" output is applied to the input of the shift register 150 in the count-and-display circuit 90, and is clocked to the "true" output 152 of the bistable circuit **150*a* when the count of the counter 162 next goes from five to six. This sets the bistable circuit 149 and, if necessary, resets the bistable circuit 178. The signal at the "set" output of the bistable circuit 149 opens the AND gate 153, and also operates the switches S8 and opens the AND gate 155, as already described, via the OR gate 147. The signal at the output of the AND gate 153 moves the switches S10, S11 and S12 from their illustrated positions to their other positions. The counter 112 is thus again transformed into a shift register, this time in cascade with the shift register 130, and clock pulses are again supplied to the rail 126, which is now connected to the rail 126*a* by the switch S11. The final count in the counter/register 112 is therefore shifted into the register 130. The output pulses from the circuit 160 are counted by the counter 152, but do not, however, operate the switches S9, since the AND gate 148** is now closed.

After twenty clock pulses, all the digits in the counter/register 112 and register 130 have moved up four stages, so that the digit originally in the stage $\mathbf{114_5}$ is in the stage $\mathbf{131_3}$. If this digit is not a nine (i.e., the nine complement of zero), then one of the two inputs of the OR gate 171 connected to the stage $\mathbf{131_3}$ will be energised: this is apparent from the second code column of the table. For the assumed final count of 001276 (999999 - 998723), the OR gate 171 therefore produces an output signal, which energises one input of the AND gate 170. This permits the immediately following signal from the counter 152, i.e., the signal at the output $\mathbf{164_4}$ thereof, to close the AND gate 153 via the OR gate 168, the AND gate 170 and the inverter 174.

The signal at the output of the AND gate 153 restores the switches S10, S11, S12 to their illustrated positions, and thus transforms the shift register 130 back to a recirculating register which contains the digits from the four most significant stages $114_2$, $114_3$, $114_4$ and $114_5$ of the counter 112, i.e., 0012. However, the switches S8 remain in the other (or non-illustrated) position and the AND gate 155 remains open, thus ensuring that the counter 112 is emptied by the clock pulses on the rail 126.

As the AND gate 153 closes, the signal at its output passes via the inverter 174 to set the bistable circuit 176 and to strobe the AND gate 177. Since the other input of the AND gate 177 is energised via the polarity display input 98 of the circuit 90, the bistable circuit 178 is set. The signal at the "set" output of the bistable circuit 176 opens the AND gates 181, 182, 183 and the "count four" signal on the other input of the AND gate 181 resets the bistable circuit 176 via the OR gate 184.

The four digits in the shift register 130 are then continuously circulated by the clock pulses on the rail **126*a* each time the counter 162 counts from one to four: the outputs $164_1$ to $164_4$ of the counter 162 therefore serve to mark the position of each digit in the shift register 130. However, when the count of the counter 162 is five or six, the supply of clock pulses to the rail 126*a* is inhibited, via the OR gate 166 and inverter 167, by the AND gate 133. As each digit is positioned in turn in the stage $131_3$ of the shift register 130, it is decoded in accordance with the second column of Table 1 by the decoder 134, which energises the appropriate line of the highway 136: the decoder 134 therefore effectively re-complements each of the four digits in the shift register 130. The appropriate number cathode of each tube 140 in the display unit 138 is thus energised. At the same time, the counter 162 energises the common anode of the tube 140 appropriate to the decade of the digit being decoded via the appropriate switch S12: the most significant digit in the counter 162 is marked by a count of four, the next by a count of one, the next by a count of two and the least significant by a count of three. Each time the count of the counter 162** is five, the appropriate combination of decimal point and V or *m*V tubes, determined by the outputs of the bistable circuits **187, 188, 188*a* is energised, while each time the count of the counter 162 is six the "plus" tube is energised. The display unit 138** thus displays +9.987V. This form of dynamic readout is similar to that described in our aforementioned Patent Application No. 58624/69.

The next positive-going excursion at the output of the bistable circuit 44 causes the whole sequence of events hereinbefore described to be repeated: it will be appreciated, therefore, that the dynamic readout continues until the opening of the AND gate 153 at the end of the fine ramp in the next measurement cycle.

Suppose, however, that the input voltage is 0.99872 volts, with the attenuator 11 in its *x*1 setting and all the switches S1 to S7 inclusive initially open. The sequence of events already described occurs, but the voltage at the output 28 rises only to just under 1 volt during the sampling interval. The capacitor C1 therefore discharges much more rapidly during its coarse ramp period, typically in just under one millisecond, and the final count in the counter 112 at the end of digitising interval is the nines complement of 099872.

This count, when transferred into the shift register 130, does not produce an output from the OR gate 171 until the counter 162 reaches a count of five, since the first digit of the final count is nine. This first digit is thus discarded by the shift register 130, which retains the next four digits, i.e., 0012, for recirculation. The output from the OR gate 171 thus sets the bistable circuit 176, via the AND gate 170, inverter 173, AND gate 153 and inverter 174, at the start of the count five state of the counter 162, which causes the AND gate 182 to set the bistable circuit 187 via the AND gate 190 and the OR gate 192 and then to reset the bistable circuit 176. The display unit 138 therefore displays the same four digits displayed in the previous example, but the signal at the "set" output of the bistable circuit 176 changes the decimal point /V/*m*V indication to give a dynamic readout of +998.7MV.

The signal at the "set" output of the bistable circuit 187 also closes the switch S6, thus connecting R2 in parallel with R1 and reducing the value of the input resistance of the integrating amplifier 16 by a factor of 10. On the next measurement cycle, and with the same input voltage of just under 1 volt, the voltage at the output 28 rises to just under 10 volts. The integrating amplifier 16 is thus again operating in the most linear part of its characteristic. However, the capacitor C1 still discharges in the same time of just under 1 millisecond, since although the voltage at the output 28 is increased by a factor of 10, the input resistance of the integrating amplifier 16 is correspondingly decreased by a factor of 10. The count in the counter 112 at the end of the digitising interval is thus again the nines complement of 099872, and this count is transferred to the shift register 130 and dynamically displayed by the display unit 138, as already described, as +998.7mV.

Similarly, if the input voltage is 0.09987 volts, again with the attenuator 11 in its X1 setting and all switches S1 to S7 inclusive initially open, the voltage at the output 28 rises only to just under 0.1 volts and the final count in the counter at the end of the first digitising interval is the nines complement of 009987. When this count is transferred to the shift register 130, the first two digits are nines and are therefore both discarded. The AND gate 153 is closed under these circumstances by the "false" output 154 of the bistable circuit **150*b*, i.e., when the counter 162 attains a count of six for the second time after the end of the fine ramp, and the next four digits of the count, i.e., 0012, are retained for circulation. The output from the inverter 174 therefore sets the bistable circuit 176 at the start of this second count six state of the counter 162, which causes the AND gate 183 to set both bistable circuits 187, 188 (the former via AND gate 193 and OR gate 192, the latter via AND gate 193 and OR gate 198) before resetting the bistable circuit 176. The bistable circuits 187, 188** change the decimal point /V/*m*V indication so that the display unit 138 this time gives a dynamic readout of +99.87 mV.

The bistable circuits 187, 188 also close both of the switches S6, S7. Thus on the next measurement cycle with this input voltage, the voltage at the output 28 again rises to just under 10 volts, since now both of the resistors R2 and R3 are connected in parallel with R1 and the input resistance of the integrating amplifier 16 is decreased by a factor of one hundred. It will be noted that when the input voltage is reduced by a factor of one hundred, i.e., by two ranges, the converter ranges downwardly to the correct range of operation of the integrating amplifier 16 in one step, omitting the range of operation in which only the switch S6 is closed.

If, while the switches S6 and S7 are closed as described above, the input voltage increases to a value over 0.1 volts, a signal will appear at the output of the AND gate 182 (indicating that a digit other than nine appeared in stage $131_3$ of the register 130 at a count of five in the counter 162). This signal resets all three bistable circuits 187, 188, 188*a* via the AND gate 189 and the OR gate 186, thus opening both switches S6, S7, and setting the attenuator 11 to its attenuation factor of 100. The voltmeter is thus immediately restored to its 1,000 volts or maximum range of operation.

Similarly, if the input voltage increases to a value over 1 volt while the switch S6 is closed (or to a value over 100 volts while the attenuator 11 is set to its attenuation factor of 100), then a signal will appear at the output of the AND gate 181, indicating that a digit other than nine appeared in stage $131_3$ of the register 130 at a count of four in the counter 162. This signal also resets all three bistable circuits 187, 188, 188*a* via the AND gate 181*a* and the OR gate 186. Also, if at the end of the transfer of the contents of the counter 112 to the register 130, i.e., when the bistable circuit 176 is set, there is a signal at F from the bistable circuit 121 indicating that the counter 112 overflowed during the digitising interval, then a signal will appear at the output of the AND gate 180. This signal resets all three bistable circuits 187, 188, 188*a* via the OR gate 186.

The following table summarizes the condition of the attenuator 11 and the switches S6, S7 for various input voltages (the X1 condition of the attenuator 11 corresponds to the "set" state of the bistable circuit 188*a*):

| Input voltage (volt) | S6 | S7 | Attenuator 11 |
|---|---|---|---|
| 1000 | OPEN | OPEN | × 1/100 |
| 100 | CLOSED | OPEN | × 1/100 |
| 10 | OPEN | OPEN | × 1 |
| 1 | CLOSED | OPEN | × 1 |
| 0.1 | CLOSED | CLOSED | ×]1 |

It can be seen from this table and the two preceding paragraphs that if the input voltage to the voltmeter exceeds that for which the voltmeter is conditioned by the attenuator 11 and the switches S6, S7, the voltmeter is automatically set to its 1,000 volt range. The voltmeter then automatically ranges downwardly to the correct range. Ranging downwardly from 10 volts has already been described: but suppose the voltmeter is initially set to its 1,000 volt range and the input voltage decreases. If the input voltage decreases to between 10 and 100 volts, then a signal will appear at the output of the AND gate 182, indicating that a digit other than 9 appeared in stage $131_3$ of the register 130 at a count of five in the counter 162: this signal closes the switch S6 as already described. If the input voltage decreases to between 1 and 10 volts, the AND gate 183 produces a signal which sets the attenuator to its *x*1 range via the bistable circuit 188*a*. If the input voltage decreases to between 100 millivolts and 1 volt, then at the instant the bistable circuit 188*a* is set by the AND gate 183, the digit in stage $131_3$ of the counter will be nine: a signal indicative of this is derived from the OR gate 171 and applied to the input 196 of the AND gate 194 by means (not shown) such as an inverter, thereby setting the bistable circuit 187 and closing the switch S6 via the OR gate 192. If the input voltage decreases to below 100 millivolts, then at the aforementioned instant of resetting the bistable circuit 188*a*, the digit in stage $131_2$ of the counter will also be 9: a signal indicative of this is derived by decoding means (not shown) similar to the OR gate 171 and inverter 172 and applied to one input of a two-input AND gate (not shown). The other input of this AND gate is commoned with the input 196 of the AND gate 194, and its output is connected to the input 197 of the AND gate 195. Thus both of the switches S6 and S7 are closed at the aforementioned instant. Finally, if the voltmeter is initially set to its 100 volt range, the only additional provision required is that the switch S6 be opened if the digit in stage $131_3$ of the register 130 is not 9 at a count of six in the counter 162. This can be achieved by means of an AND gate (not shown) having three inputs respectively connected to the output of the AND gate 182, the output of the OR gate 171 and the "reset" output of the bistable circuit 188*a;* the output of this AND gate is connected to one input of an OR gate (not shown) which is connected between the output of the OR gate 186 and the "reset" input of the bistable circuit 187.

It will be appreciated that the counter 112 produces substantially the same final count for a given voltage at the output of the attenuator 11, regardless of the respective states of the switches S6, S7. Thus for the 10 volt range and the ranges below the 10 volt range, automatic ranging is actually effected by providing the voltmeter, on the 10 volt range, with two decades of resolution more than is required, so that there is one more decade of resolution than is required on the 1 volt range, and the required number of decades of resolution on the 100 millivolt range. The shift register 130 is then used to select from the count in the counter 112 the four most significant digits appropriate to each range. In general, if it is desired to measure an input voltage to $N$ significant figures of resolution in each of $R$ ranges of magnitude of the input signal, then the counter 112 should have at least $(N + R - 1)$ stages, and the shift register 130 should have $N$ stages which are arranged to receive the $N$ most significant figures of the count in the counter 112. The attenuator 11 extends upwardly by two decades the range of input voltages capable of being measured by the voltmeter.

The greater part of the control logic circuitry and the count and display logic circuitry is particularly suitable for production as a single integrated circuit.

The switches S6 and S7 are provided to vary the input resistance (and therefore the time constant) of the integrating amplifier 16 so that is operates on the most linear part of its characteristic in each of the ranges. It will be appreciated that this could be achieved in ways other than that specifically described, for example by keeping the value of the input resistance of the integrating amplifier 16 constant and varying the value of the capacitor C1.

If desired, the input 14 of the integrating amplifier 16 may be clamped by means of a suitable switching device to the zero volt datum level at the input 32 of the comparator 30, which datum level also serves as the reference level for the amplifier 27, during the short pause between the end of the coarse ramp and the start of the fine ramp: this serves to stabilise the output of the integrating amplifier 16 against drift. Similar clamping may be effected between the end of the fine ramp and the start of the next measurement cycle, and a similar pause and clamping may be effected between the end of the sampling interval and the start of the coarse ramp.

Many other modifications may be made to the described embodiment of the invention. For example, the shift register 130 could be replaced by N R-way solid-state switches which are effectively ganged together, so as to selectively connect the N stages of an N-stage display unit with R different groups of N successive stages of the counter 112: alternatively, an arrangement of AND gates could be used to achieve the same effect. Further, although the switches, S8 to S12 have been described as electromechanical switches, they would obviously be replaced by suitable solid state switches. Also, although the invention has been described in relation to the use of positive logic, it will be apparent that other forms of logic, such as negative logic or a combination of positive and negative logic, could be used if desired. Finally, in voltmeters provided with input attenuators such as the attenuator 11, which include an electro-mechanical relay for selecting their attenuation range, ranging may if desired be effected in two steps under some circumstances. Thus, if an overrange is detected when the attenuator is not selected (e.g., when either the switches S6 or S6 and S7 are closed), then the voltmeter can be arranged firstly to open both switches S6 and S7, and then to select the attenuator 11 if necessary. Similarly, if the attenuator 11 is selected and an underrange is detected, the voltmeter may be arranged firstly to cancel the selection of the attenuator and then to range down further with the switches S6 and S7 if necessary. This still provides substantially more rapid ranging than is achieved in known auto-ranging voltmeters.

What is claimed is:

1. An auto-ranging analogue-to-digital converter of the integrating type, for converting an analogue signal to a digital signal which is representative of the magnitude of the analogue signal and which has $N$ significant figures of resolution in a respective one of $R$ successive ranges of magnitude of the analogue signal, comprising:

integrating means responsive to the analogue signal for producing an output signal whose magnitude is dependent upon the magnitude of the analogue signal;

means for converting the output signal from the integrating means to an intermediate digital signal which is representative of the magnitude of the analogue signal and which has up to at least $(N+R-1)$ significant figures of resolution for analogue signals whose magnitude lies in the highest range;

selection means for selecting from the intermediate digital signal an output digital signal composed of the $N$ most significant figures of the intermediate digital signal;

means for producing a further signal indicative of the actual number of significant figures in the intermediate digital signal, whereby said further signal is also indicative of the range in which the magnitude of the analogue signal lies; and adjusting means, responsive to said further signal, for adjusting the operation of the integrating means to bring the magnitude of the output signal produced thereby within a single predetermined range of magnitudes, irrespective of the range in which the magnitude of the analogue signal lies.

2. A converter as claimed in claim 1, wherein there is provided means for applying the analogue signal to the integrating means during a sampling interval of predetermined duration, so as to cause the output of the integrating means to ramp away from a datum level to a level which constitutes said output signal, and means for applying a reference signal to the integrating means during a digitising interval, so as to cause the output of the integrating means to ramp towards a second datum level, said means for converting the output signal from the integrating means comprising an electrical pulse counter, and clock pulse generator means arranged to supply clock pulses to the counter throughout the digitising interval.

3. A converter as claimed in claim 2, wherein the first and second datum levels are the same.

4. A converter as claimed in claim 2, wherein the integrating means includes an input resistance and a capacitance arranged to be charged through the input resistance, at least one of the resistance and the capacitance being adjustable in value, and the adjusting means is operable to adjust the value of said one of the resistance and the capacitance so as to tend to bring the magnitude of said output signal within said single predetermined range, the value of said one of the resistance and the capacitance remaining unchanged between any given sampling interval and its corresponding digitising interval.

5. A converter as claimed in claim 4, wherein the value of the capacitance is fixed and the value of the resistance is adjustable.

6. A converter as claimed in claim 5, wherein the resistance comprises a plurality of resistors, and the adjusting means comprises a switching arrangement operable to connect an appropriate combination of the resistors in the input of the integrating means.

7. A converter as claimed in claim 6, wherein the input resistors of the integrating means are connected together in parallel.

8. A converter as claimed in claim 7, wherein the switching arrangement comprises at least one switch device, for example a semi-conductor device such as a field effect transistor, connected in series with one of the resistors.

9. A converter as claimed in claim 2, wherein the means for converting the output signal from the integrating means further includes scaling means arranged to scale down the reference signal and the numerical weight with which the clock pulses are counted by a common factor when the output of the integrating means reaches a value close to the second datum level.

10. A converter as claimed in claim 9, wherein the output of the integrating means is arranged to ramp from said level constituting said output signal through the second datum level to said value close to the second datum level, and the scaling means includes means for reversing the polarity of the reference signal, so as to cause the output of the integrating means to ramp back from said value to the second datum level, and means for subtracting clock pulses from the count in the counter while the output of the integrating means is ramping back from said value to the second datum level.

11. A converter as claimed in claim 1, wherein the adjusting means further includes an adjustable attenuator coupled to the input of the integrating means and operable to attenuate the analogue signal before its application to the integrating means.

12. A converter as claimed in claim 2, wherein the counter has at least $(N+R-1)$ cascaded stages, each of which corresponds to a respective one of the significant figures of the intermediate digital signal.

13. A converter as claimed in claim 12, wherein each stage of the counter comprises a plurality $m$ of bistable circuits, and the counter includes switching means operative to switch the configuration of the bistable circuits from that composing the counter to that of a shift register.

14. A converter as claimed in claim 13, wherein each stage of the counter is a decade stage consisting of a five bit shift register connected in Johnson ring configuration.

15. A converter as claimed in claim 13, wherein the selection means comprise a further shift register having $N$ stages, each stage corresponding to a respective one of the significant figures of the output digital signal, and means for shifting the figures of intermediate digital signal, in descending order of their significance, from the counter into the further shift register until the $N$ most significant figures of the intermediate digital signal are positioned in the further shift register.

16. A converter as claimed in claim 15, wherein the further shift register includes switching means operative to transform it into a recirculating shift register when it contains said output digital signal, which switching means operates in response either to the presence of a digital signal representative of a figure of the output digital signal other than zero in the $N$th stage of the further shift register when the figures of the output digital signal have been shifted through less than a predetermined number of stages of the further shift register, or to the shifting of the figures of the output digital signal through said predetermined number of stages.

17. A converter as claimed in claim 15, wherein there is provided means for effecting dynamic readout of the figures of the output digital signal in the further shift register, said means being connected to one stage of the further shift register so as to read out the figures as they are circulated one by one into this one stage.

18. An electrical pulse counter for use in an analogue-to-digital converter, said counter comprising a plurality $P$ of cascaded stages, each of which counts one number of digit in a number system of radix $n$ and each of which comprises a plurality $m$ of bistable circuits and switching means operative to switch the configuration of the bistable circuits from that composing the counter to that of a shift register, means for supplying shift pulses to the shift register, and means operative between each successive group of $m$ shift pulses to transfer the complement of the number in the $P$th stage into the first stage, whereby to transform the number in the 2nd to the Pth stages of the shift register at the start of the group of $m$ pulses into the complement of that number after $P$ groups of pulses.

19. A counter as claimed in claim 18, wherein the stages of the counter are disposed so that the Pth stage is adjacent to the 1st stage.

* * * * *

UNITED STATES PATENT OFFICE

CERTIFICATE OF CORRECTION

Patent No. 3,772,683 Dated November 13, 1973

Inventor(s) Howard Anthony Dorey

It is certified that error appears in the above-identified patent and that said Letters Patent are hereby corrected as shown below:

IN THE HEADING:

Insert:

-- [30] Foreign Application Data

September 29, 1971 Great Britain...45371/71

IN THE CLAIMS:

Column 20, line 16, change "of" to -- or --.

Signed and sealed this 20th day of May 1975.

(SEAL)
Attest:

RUTH C. MASON
Attesting Officer

C. MARSHALL DANN
Commissioner of Patents
and Trademarks